(12) United States Patent
Hess et al.

(10) Patent No.: US 7,755,550 B2
(45) Date of Patent: Jul. 13, 2010

(54) SYSTEM AND METHOD FOR ISOLATING AN INDIVIDUAL RADIATION PATTERN OF A GIVEN RADIATOR IN THE PRESENCE OF OTHER RADIATORS

(75) Inventors: Doren W. Hess, Duluth, GA (US); Jeffrey A. Fordham, Cumming, GA (US)

(73) Assignee: Microwave Instrumentation Technologies LLC, Suwanee, GA (US)

( * ) Notice: Subject to any disclaimer, the term of this patent is extended or adjusted under 35 U.S.C. 154(b) by 681 days.

(21) Appl. No.: 11/808,242

(22) Filed: Jun. 7, 2007

(65) Prior Publication Data
US 2008/0094295 A1    Apr. 24, 2008

Related U.S. Application Data

(60) Provisional application No. 60/852,965, filed on Oct. 20, 2006.

(51) Int. Cl.
    G01R 29/10    (2006.01)
(52) U.S. Cl. ........................... 343/703; 343/766

(58) Field of Classification Search ................. 343/703, 343/766
    See application file for complete search history.

(56) References Cited

U.S. PATENT DOCUMENTS

| 4,553,145 | A | * | 11/1985 | Evans | ........................ | 342/360 |
| 5,365,241 | A | * | 11/1994 | Williams et al. | ............ | 343/703 |
| 6,285,330 | B1 | * | 9/2001 | Perl | ........................... | 343/703 |

* cited by examiner

Primary Examiner—Douglas W Owens
Assistant Examiner—Dieu Hien T Duong
(74) Attorney, Agent, or Firm—McKenna Long & Aldridge LLP

(57) ABSTRACT

Disclosed is a system and method for determining the far-field radiation pattern of an antenna within a composite radiator. The method involves performing a near-field scan at an angular sample spacing corresponding to a minimum sphere centered at the crossing of two rotational axes encompassing the composite radiator, computing coefficients based on the near-field scan, adding a phase adjustment to the far field based on a translation from the scan origin to a point within the antenna, re-computing the coefficients, and truncating the re-computed coefficients, thereby retaining a number of coefficients corresponding to the diameter of a minimum sphere encompassing the antenna only. In doing so, the far-field radiation pattern of the antenna may be determined from the truncated set of coefficients with interference effects of the composite radiator substantially mitigated.

20 Claims, 6 Drawing Sheets

SYSTEM AND METHOD FOR ISOLATING AN INDIVIDUAL RADIATION PATTERN OF A GIVEN RADIATOR IN THE PRESENCE OF OTHER RADIATORS

This application claims the benefit of U.S. Provisional Patent Application No. 60/852,965, filed on Oct. 20, 2006, which is hereby incorporated by reference for all purposes as if fully set forth herein.

BACKGROUND OF THE INVENTION

1. Field of the Invention

The present invention generally relates to RF/microwave antennas. More particularly, the present invention relates to determining radiation patterns of RF/microwave radiators in the presence of numerous conductive surfaces and other simultaneous radiators.

2. Discussion of the Related Art

The ubiquity of wireless communications, as well as other wireless applications such as GPS, etc., has led to the deployment of RF/microwave antennas in a host of environments. For example, RF communications and GPS antennas are commonly installed on vehicles such as cars, boats, and airplanes. In the exemplary case of an automobile with a satellite communications antenna mounted on its roof, the antenna's radiation pattern can be altered significantly by the conducting surfaces of the roof, hood, and trunk of the car. In order to assure an uninterrupted radio link, it is necessary to determine the antenna's far-field radiation pattern in the presence of these sources of interference.

Continuing with the automobile example, the vehicle's metallic surfaces are highly conductive and may be considered as a "ground plane." As such, radiated energy from the antenna, such as from the antenna's side and rear lobes, induces currents in the metallic surfaces, resulting in a plurality of radiators that interfere with the radiation pattern of the antenna. Accordingly, the entire surface of the automobile may be considered a complex composite radiator.

To determine properly the far-field radiation pattern, it is generally required to determine the far-field radiation pattern of the automobile/antenna combination as well as the far-field pattern of the antenna independent of the effects of the automobile's metallic surfaces.

It is impractical to measure the far-field radiation pattern for an object the size of an automobile. Accordingly, near-field scanning is typically done, followed by transformation techniques that convert the measured near-field pattern to a far-field pattern. However, there are problems in related art approaches to performing the near-field scan. It is extremely difficult to measure the near-field radiation pattern of the car with the antenna, and to filter out the effects of the car on the antenna's far-field radiation pattern computed from the near-field scan. First, related art approaches to filtering the effects of the car from data derived from the near-field scan require that the antenna be located at the origin of the scan coordinate axes. Further, near-field scanning requires that the antenna's radiation pattern be measured in a spherical scan pattern that encompasses the entire automobile. Accordingly, related art filtering techniques require an elaborate gantry and turntable whereby the rotation axis of the gantry and the rotation axis of the turntable intersect at the antenna. Given the location of the antenna on the automobile, this is generally impracticable. Second, it is extremely difficult to determine the far-field radiation of the pattern without secondary radiative effects of the automobile itself.

Although the above discussion uses an automobile as an example, the same issues arise with other vehicles, such as airplanes and boats, as well as other types of antenna applications, such as satellite-mounted antennas, phased-array antennas, etc. In any of these cases, the antenna is part of a composite radiator (including the auto body, airplane skin, phased array structure, etc.), the combination of which alters the radiation pattern of the antenna.

Accordingly, what is needed is a system and method for determining the radiation pattern of an antenna as a part of a composite radiator that enables a determination of the far-field radiation pattern of the antenna, while not requiring that the antenna be located at the origin of the coordinate system of the scan mechanism.

SUMMARY OF THE INVENTION

The present invention provides a system and method for isolating an individual radiation pattern of a given radiator in the presence of other radiators that obviates one or more of the aforementioned problems due to the limitations of the related art.

Accordingly, one advantage of the present invention is that it better enables determining the far-field radiation pattern of an antenna that is within a composite radiator.

Another advantage of the present invention is that it reduces the complexity of the scan apparatus required to do a near-field scan of a large composite radiator in which the antenna is not centered.

Yet another advantage of the present invention is that it obviates the need to modify an antenna measurement system to place the antenna at the crossing point of scan axes.

Additional advantages of the invention will be set forth in the description that follows, and in part will be apparent from the description, or may be learned by practice of the invention. The advantages of the invention will be realized and attained by the structure pointed out in the written description and claims hereof as well as the appended drawings To achieve these and other advantages, the present invention involves a method for determining a far-field pattern of an antenna within a composite radiator. The method comprises performing a near-field scan of the composite radiator; computing a first plurality of coefficients corresponding to the near-field scan; computing a first far-field pattern corresponding to the first plurality of coefficients; computing a phase adjustment corresponding to a translation from a scan origin to a point within the antenna; computing a second far-field pattern corresponding to the first far-field pattern and the phase adjustment, the second far-field pattern having a second plurality of coefficients; reducing the second plurality of coefficients to a third plurality of coefficients, wherein a quantity of the third plurality of coefficients corresponds to a minimum sphere that is centered at the point within the antenna and substantially exclusively encompasses the antenna; and computing a third far-field pattern corresponding to the third plurality of coefficients.

In another aspect of the present invention, the aforementioned and other advantages are achieved by a system for determining a far-field radiation pattern of an antenna included within a composite radiator. The system comprises a scan probe; a two-axis position control system; and a host computer coupled to the two-axis position control system, the host computer having a computer readable medium encoded with a program for measuring a near-field radiating pattern according to a spherical scan at an angular sample spacing; computing a first plurality of coefficients corresponding to the near-field pattern; computing a phase adjustment corresponding to a translation from an origin corresponding to the spherical scan to a point within the antenna; computing a second plurality of coefficients, wherein the second plurality of coefficients corresponds to a far field pattern and the phase adjustment; reducing the second plurality of coefficients according to a minimum sphere substantially exclusively encompassing the antenna; computing a third plurality of coefficients corresponding to the reduced second plurality of coefficients; and computing the far-field radiation pattern based on the third plurality of coefficients.

In another aspect of the present invention, the aforementioned and other advantages are achieved by a method for determining a far-field pattern of an antenna within a composite radiator. The method comprises performing a near-field scan of the composite radiator, wherein the near-field scan has a range length greater than one half a diameter of a first minimum sphere that encompasses the composite radiator and has a first center at an origin defined by a crossing point of a pair of scan coordinate axes; computing a first far-field pattern corresponding to the near-field scan, the first far-field pattern having a first plurality of coefficients corresponding to a sampling on a second minimum sphere encompassing the composite radiator and having a center within the antenna; computing a phase adjustment corresponding to a translation from the origin to a center of a third minimum sphere, wherein the center of the third minimum sphere is located within the antenna, and wherein the third minimum sphere substantially exclusively encompasses a radiating portion of the antenna; computing a second far-field pattern that includes the phase adjustment, the second far-field pattern having a second plurality of coefficients; selecting a third plurality of coefficients from the second plurality of coefficients, wherein a quantity of the third plurality corresponds to a diameter of the third minimum sphere; and computing a third far-field pattern based on the third plurality of coefficients.

In another aspect of the present invention, the aforementioned and other advantages are achieved by a computer readable medium encoded with a program for determining a far-field pattern of an antenna within a composite radiator. The program comprises the steps of measuring a near-field radiating pattern according to a spherical scan at an angular sample spacing; computing a first plurality of coefficients corresponding to the near-field pattern; computing a phase adjustment corresponding to a translation from an origin corresponding to the spherical scan to a point within the antenna; computing a second plurality of coefficients, wherein the second plurality of coefficients correspond to a far field pattern and the phase adjustment; reducing the second plurality of coefficients according to a minimum sphere substantially exclusively encompassing the antenna; computing a third plurality of coefficients corresponding to the reduced second plurality of coefficients; and computing the far-field pattern based on the third plurality of coefficients.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
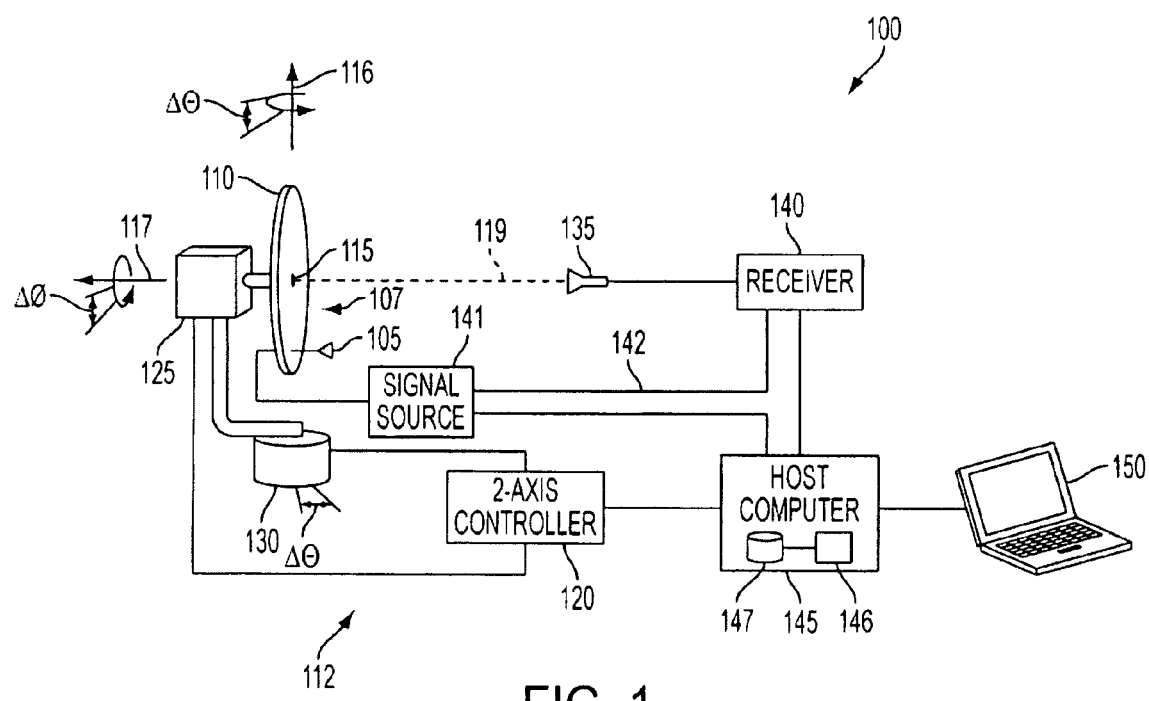
FIG. 1 illustrates an exemplary system for determining an antenna far-field radiation pattern according to an embodiment of the present invention.

FIG. 1 illustrates an exemplary system 100 for determining an antenna far-field radiation pattern according to the present invention. System 100 includes a composite radiator 107, which includes an antenna 105 that is mounted to a ground plane 110. Antenna 105 may be connected to a signal source 141. Ground plane 110 may include the roof of a car, part of the fuselage of an airplane, structure of a phased antenna array, etc. Ground plane 110 may be mounted to a two-axis position control system 112, which controls the orientation of ground plane 110 according to a coordinate system having an origin 115 defined by the crossing of an azimuth axis 116 and a roll axis 117.

Exemplary system 100 further includes a scan probe 135, which may be a microwave horn antenna. Scan probe 135 may be fixedly mounted substantially along a range axis 119 from origin 115 at a distance that is described below. Accordingly, system 100 may be referred to as a "fixed line of sight" antenna measurement system. Scan probe 135 may be a vertically or horizontally polarized single-ported microwave horn antenna. In this case, scan probe 135 may be mounted so that its polarization orientation may be re-oriented, either manually or by a rotational actuator (not shown). Scan probe 135 may be connected to receiver 140, which may be connected to host computer 145. Signal source 141 may provide a phase reference signal 142 to receiver 140, which receiver 140 uses to determine the phase of the signal detected by scan probe 135. Signal source 141 may also be connected to host computer 145.

Host computer 145 may include a processor 146, and a memory 147. Memory 147 may be encoded with a set of computer instructions and data (hereinafter "instructions" or "the software"), which processor 146 executes in performing processes associated with the present invention. Host computer 145 may be connected to a user interface 150. Host computer 145 may include one or more computers that may be co-located or connected over a distributed network such as a LAN, WAN, or the internet. Memory 147 may include a single memory device, or may include a plurality of memory devices and databases that may be distributed over a network. One skilled in the art will readily appreciate that many variations to host computer 145, processor 146, memory 147, and user interface 150, are possible and within the scope of the invention.

Antenna 105 may be a microwave horn antenna, a patch antenna, a dipole, a monopole, a wire antenna, etc. Antenna 105 is illustrated in FIG. 1 as being offset from origin 115, as would likely be the case with an antenna mounted on the roof of a car, an antenna mounted in an aircraft skin, etc.

Two-axis position control system 112 may include a two-axis controller 120, a rotational actuator 125, and an azimuth actuator 130. Two-axis controller 120 accepts commands from host computer 145 and converts the commands into control signals for rotational actuator 125 and azimuth actuator 130. Azimuth actuator 130 rotates composite radiator 107 around azimuth axis 116 by an angular change $\Delta\theta$. Rotational actuator 125 rotates composite radiator 107 around roll axis 117 by an angular change $\Delta\phi$. As illustrated in FIG. 1, azimuth axis 116 may lie in a vertical plane and may remain fixed, whereas roll axis 117 may lie in a horizontal plane and rotate around azimuth axis 116. Accordingly, two-axis position control system 112 may orient composite radiator 107 at any series of specified two-axis angular orientations to perform a spherical near-field scan of composite radiator 107 encompassing ground plane 110 and antenna 105. Two-axis position control system 112 may have sufficient precision to establish and maintain a two-axis orientation of composite radiator 107 with sufficient accuracy to perform a near-field scan at a specified angular sample spacing as described below.

Two-axis position control system 112 may include manual controllers in place of or in conjunction with rotational actuator 125 and azimuth actuator 130. Further, two-axis position control system 112 may include more than, or fewer than, two axes of control. It will be readily apparent to one of ordinary skill that many variations to two-axis position control system 112 are possible and within the scope of the invention.

Figure 2:
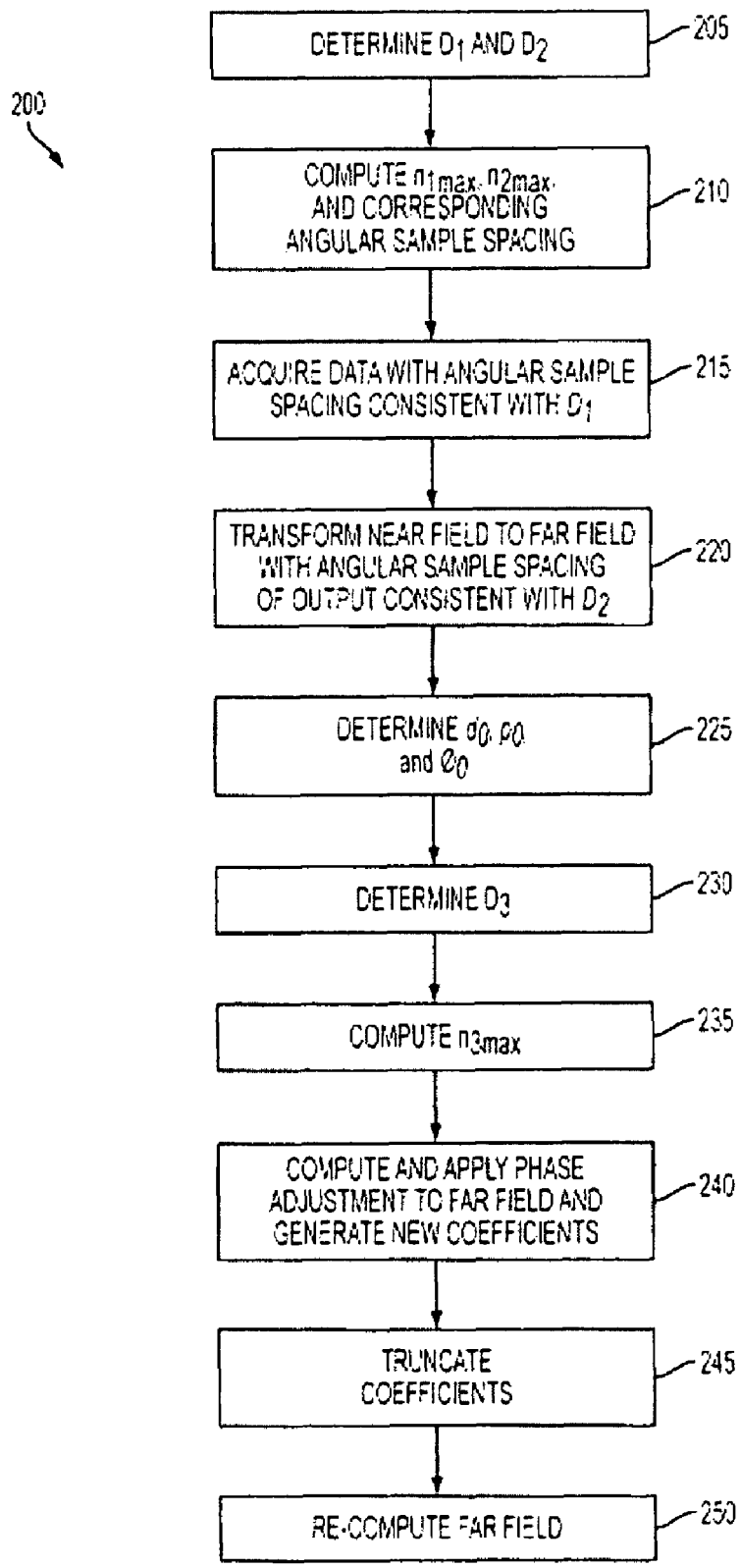
FIG. 2 illustrates an exemplary process for determining an antenna far-field radiation pattern according to an embodiment of the present invention.

FIG. 2 illustrates an exemplary process 200 for determining an antenna far-field radiation pattern according to the present invention. All or part of process 200 may be performed by processor 146 executing the software. Process 200 may incorporate user interaction via user interface 150.

At step 205, the software executed by processor 146 may store the values for two diameters: $D_1$ and $D_2$, in memory 147. Diameter $D_1$ may be used to determine an angular sample spacing of the near-field scan, and diameter $D_2$ may be used in determining an angular sample spacing of an output of a mathematical transformation used to compute the far-field radiation pattern from the near-field scan data. Diameters $D_1$ and $D_2$ are illustrated in FIG. 3.

Figure 3:
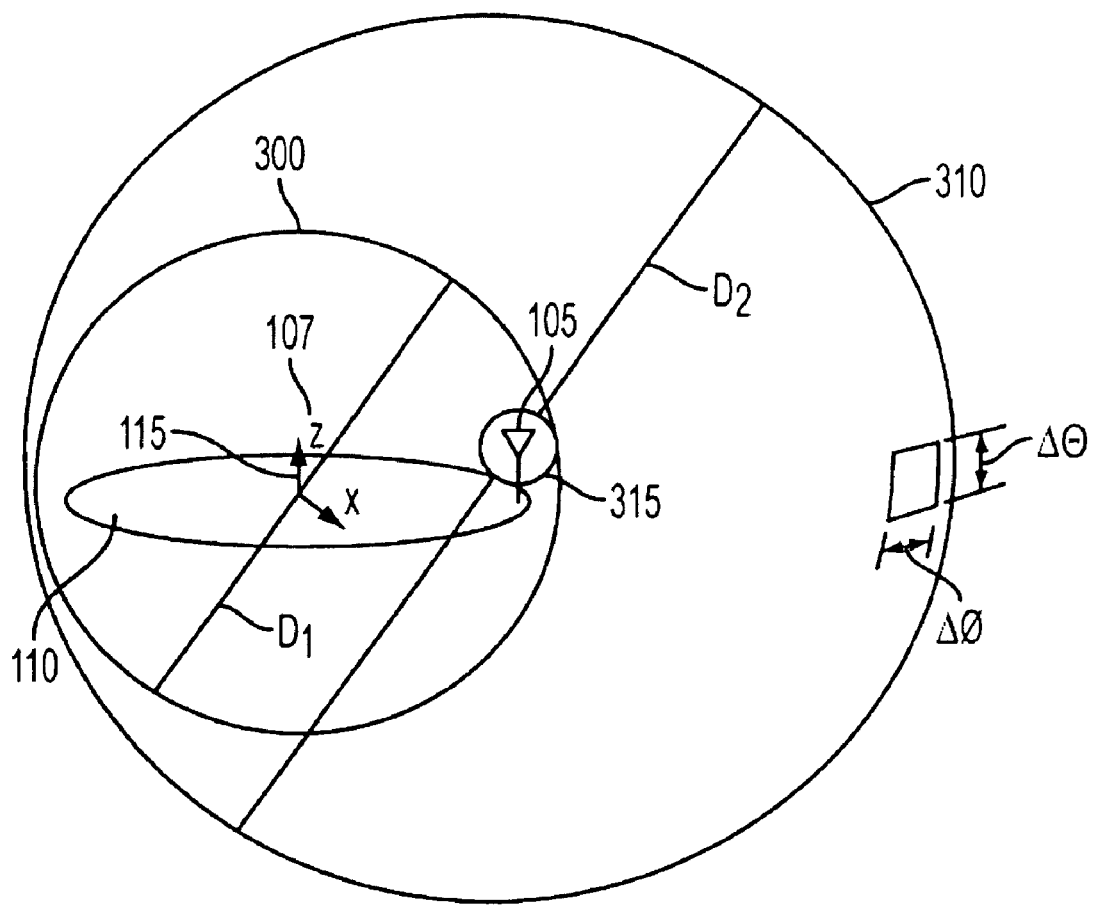
FIG. 3 illustrates a plurality of minimum spheres associated with the present invention.

FIG. 3 illustrates two spheres, 300 and 310, which respectively have diameters $D_1$ and $D_2$. Spheres 300 and 310 encompass composite radiator 107 with different centers and diameters. A third sphere 315 encompasses the radiative portion of antenna 105. First sphere 300 may be a minimum sphere, centered at origin 115 and having a diameter $D_1$, such that sphere 300 encompasses composite radiator 107. Diameter $D_1$ may be determined by directly measuring the diameter of composite radiator 107 using, for example, a tape measure. In the case that composite radiator 107 has non-circular shape, such as a car or airplane, diameter $D_1$ may be determined by directly measuring a major dimension (e.g., a maximum length) of composite radiator 107.

As used herein, the term "minimum sphere" refers to the smallest sphere that encompasses a plurality of radiative sources, such as the radiative surfaces of composite radiator 107, or the radiative surface of antenna 105 exclusively, plus one or two wavelengths of interest. The wavelength of interest is the wavelength corresponding to the far-field radiation pattern to be determined.

Second sphere 310 may be a minimum sphere that encompasses the entire composite radiator 107, and which is centered at a point within antenna 105, and which has a diameter $D_2$ plus one or two wavelengths. If antenna 105 is a horn antenna, or other type of aperture antenna, the center of second sphere 310 may be within the aperture of antenna 105. It will be readily apparent to one skilled in the art that the location of the center of second sphere 310, being within antenna 105, may vary depending on the type of antenna used. Third sphere 315 is discussed with regard to later steps in process 200.

The values for $D_1$ and $D_2$ may be provided in step 205 by a user via user interface 150. Alternatively, the values for diameters $D_1$ and $D_2$ may be already known and stored in memory 147. In the latter case, the user may select the appropriate values for $D_1$ and $D_2$.

At step 210, processor 146 may execute instructions to compute $n_{1\ max}$, which refers to the smallest maximum spherical modal order necessary to adequately sample the contour of the far-field radiation pattern of composite radiator 107, according to Nyquist's theorem for a band-limited function. The value $n_{1\ max}$ may also refer to the smallest maximum spherical modal order necessary to determine the spherical modal coefficients (hereinafter "coefficients") from the near-field radiation pattern measured in step 215, and to represent the far-field radiation pattern based on the diameter $D_1$ of first sphere 300. As used herein, Nyquist's theorem is applied to spatial sampling of a contour having a finite range of spatial frequencies. Processor 146 may execute instructions to compute the value for n/max according to the following relation:

$$n_{1\max} = \frac{\pi D_1}{\lambda} + 10$$

where $\lambda$ is the wavelength of interest, and $D_1$ is the diameter of first sphere 300. For further theoretical background to the derivation of this relation, as well as further details of near-field scanning, one may refer to *Spherical Near-Field Antenna Measurements*, J. E. Hansen, Ed., Peter Peregrinus Press, London, UK, 1988, (hereinafter "Hansen").

Figure 4:
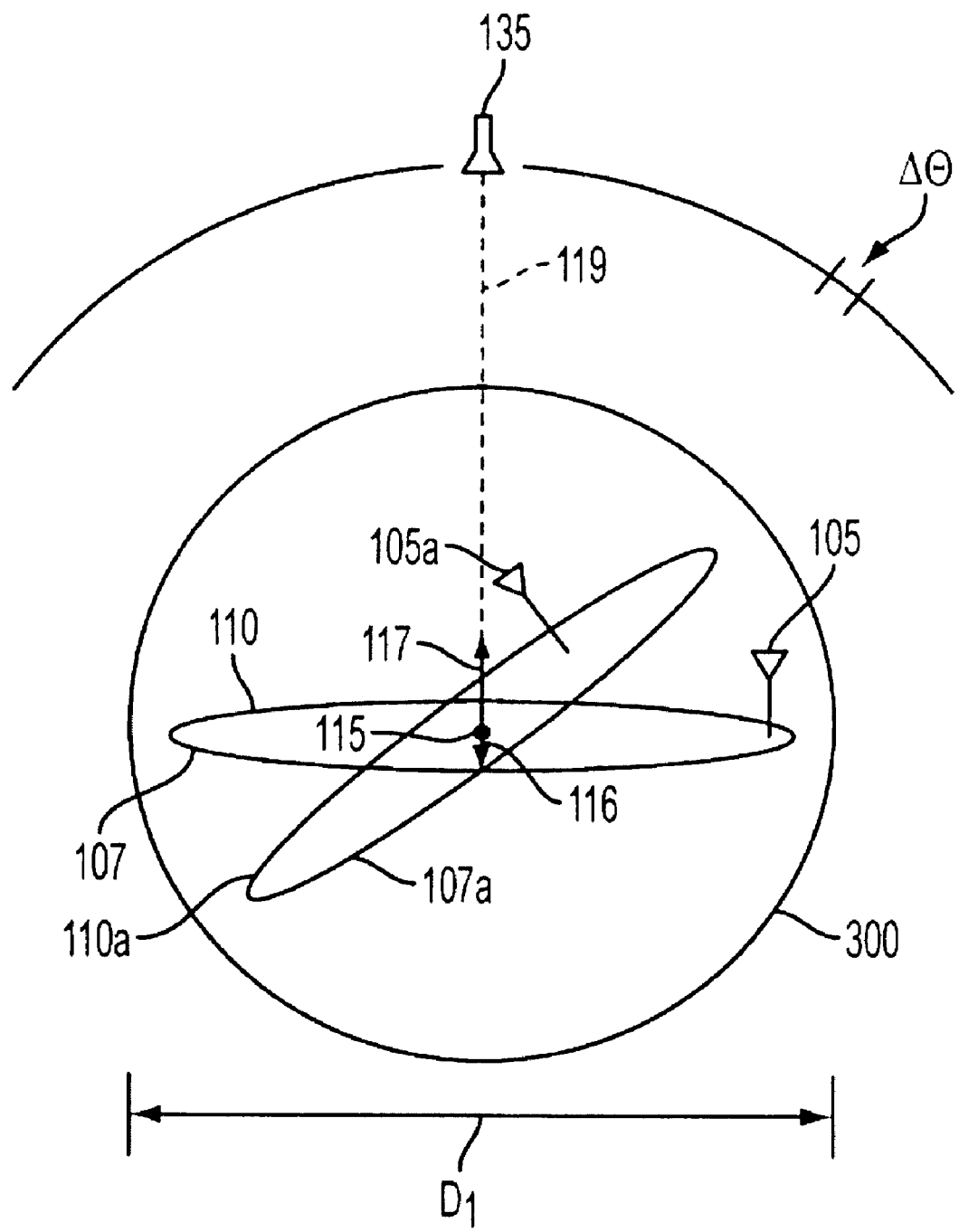
FIG. 4 illustrates an exemplary approach to performing a near-field scan in accordance with the present invention.

Further to step 210, processor 146 may execute instructions to compute a maximum angular sample spacing according to the following relations:

$$\Delta\theta_{in} < \frac{\lambda}{D_1}$$

and $$\Delta\phi_{in} < \frac{\lambda}{D_1}$$

where $\Delta\theta_{in}$, and $\Delta\phi_{in}$ respectively correspond to the maximum angular sample spacing (in radians) of the polar angle $\Delta\theta$ and azimuthal angle $\Delta\phi$, as illustrated in FIGS. 1, 3, and 4.

Further to step 210, processor 146 may execute instructions to compute $n_{2\ max}$, which refers to the smallest maximum modal order of the coefficients necessary to represent the far-field radiation pattern of antenna 105. The software computes this according to the following relation:

$$n_{2\max} = \frac{\pi D_2}{\lambda} + 10$$

where $D_2$ is the diameter of second sphere 310, and $\lambda$ is the wavelength of interest. The value for $n_{2\ max}$ may be stored in memory 147. One may refer to Hansen for information regarding the derivation of this relation.

Further to step 210, processor 146 may execute instructions to compute the maximum angular sample spacing of the output of the near-field to far-field transformation described below. It may do so according to the following relations:

$$\Delta\theta_{out} < \frac{\lambda}{D_2}$$

and $$\Delta\phi_{out} < \frac{\lambda}{D_2}$$

where $\Delta\theta_{out}$ and $\Delta\phi_{out}$ are in radians.

At step 215, near-field radiation pattern data is acquired, for example, by using system 100. Near-field radiation pattern data may be collected by transmitting an RF signal through antenna 105 (using signal source 141) at wavelength of interest $\lambda$, and detecting the transmitted RF signal (in amplitude and phase) using scan probe 135. Data may be collected for a succession of orientations of composite radiator 107. With scan probe 135 fixed, and with two-axis position control system 112 orienting composite radiator 107, the transmitted RF signal is detected for a plurality of orientations such that data is acquired at angular sample spacing $\Delta\theta_{in}$ and $\Delta\phi_{in}$ over a scan surface.

FIG. 4 illustrates a slightly off-axis plan view of composite radiator 107 and scan probe 135 of system 100. FIG. 4 illustrates multiple orientations of composite radiator 107/107a, including ground plane 110/110a, and antenna 105/105a. Referring to FIG. 4, scan probe 135 may be placed along range axis 119, at a range length, or measurement radius, that is greater than $0.5D_1$. Here, the range length is the distance from scan probe 135 to origin 115 along range axis 119. It will be readily apparent to one skilled in the art that another coordinate axis configuration for system 100 may be used, provided that it can perform at least a two-axis near-field scan of composite radiator 107.

In executing step 215, processor 146 executes instructions to command signal source 141 to transmit an RF signal at wavelength of interest $\lambda$. Processor 146 further executes instructions to command two-axis position control system 112 to orient composite radiator 107 at an initial orientation.

In acquiring near-field radiation data, processor 146 may execute instructions to issue commands to two-axis position control system 112 to orient composite radiator 107 in a succession of orientations. For each orientation, scan probe 135 receives the RF signal being transmitted by antenna 105 at wavelength of interest $\lambda$. Receiver 140 receives the signal from scan probe 135 and generates in-phase and quadrature (i-q) data for two orthogonal polarization states. If scan probe 135 is a dual port probe, i-q data for both polarization states may be generated substantially simultaneously. If a single port probe is used, two successive signal samples may be taken. In this case, a first signal sample may be taken at a first orientation of scan probe 135. Then scan probe 135 may be rotated by 90° around range axis 119, and another signal sample may be taken at the second orientation. Composite radiator 107 may remain substantially fixed during the acquisition of these two samples.

Receiver 140 may receive phase reference signal 142 from signal source 141, which provides information pertaining to the time of zero-crossing of the signal generated by signal source 141. Receiver 140 may use this information to compute the phase of the signal detected by scan probe 135 by computing the difference in time between the zero-crossings of the signal from signal source 141 and the signal detected by scan probe 135. Alternatively, receiver 140 may generate signal data in a phasor or magnitude-phase representation format in place of an i-q format. One skilled in the art will readily appreciate that such variations in providing receiver signal data are possible and within the scope of the invention.

Host computer 145 may receive the i-q data from receiver 140 and store it, along with the commanded orientation of composite radiator 107, in memory 147. The acquisition and storing of two-axis orientation and i-q data is repeated for each orientation of composite radiator 107 at angular sample spacing $\Delta\theta_{in}$ and $\Delta\phi_{in}$. At the end of step 215, a set of i-q data for each polarization state at each point on the scan surface having diameter $D_1$ at angular sample spacing $\Delta\theta_{in}$ and $\Delta\phi_{in}$ may be stored in memory 147.

At step 220, processor 146 executes instructions to transform the near-field radiation pattern data into data representing the far-field radiation pattern. In doing so, processor 146 may execute instructions to compute a set of vector spherical harmonic coefficients that define the far-field radiation pattern $\vec{K}(\theta,\phi)$ according to the following relation:

$$FarFieldCompositeRadiator = \vec{K}(\theta,\phi)$$
$$= \sum_{n=1}^{n2max} \sum_{m=-n}^{m=n} \sum_{s=1}^{s=2} T_{s,m,n} \cdot \vec{K}_{s,m,n}(\theta,\phi)$$

where $n_{2\ max}$ was computed in step 210, s corresponds to polarization state, and $\vec{K}_{s,m,n}(\theta,\phi)$ is a vector spherical mode that is a preset vector spherical harmonic basis term corresponding to indices s, m, n and to coefficient $T_{s,m,n}$. One may refer to Hansen, section 2.4, for a discussion of the theory behind the derivation of this relation. The above relation may be expressed more simply as $$FarFieldCompositeRadiator = \sum_{n=1}^{n2max} \sum_{m=-n}^{m=n} \sum_{s=1}^{s=2} T_{s,m,n} \cdot Mode_{s,m,n}.$$

Algorithmic techniques for solving for coefficients $T_{s,m,n}$ are known to the art and discussed in Hansen. The $T_{s,m,n}$ coefficients may be stored in memory 147.

Figure 5:
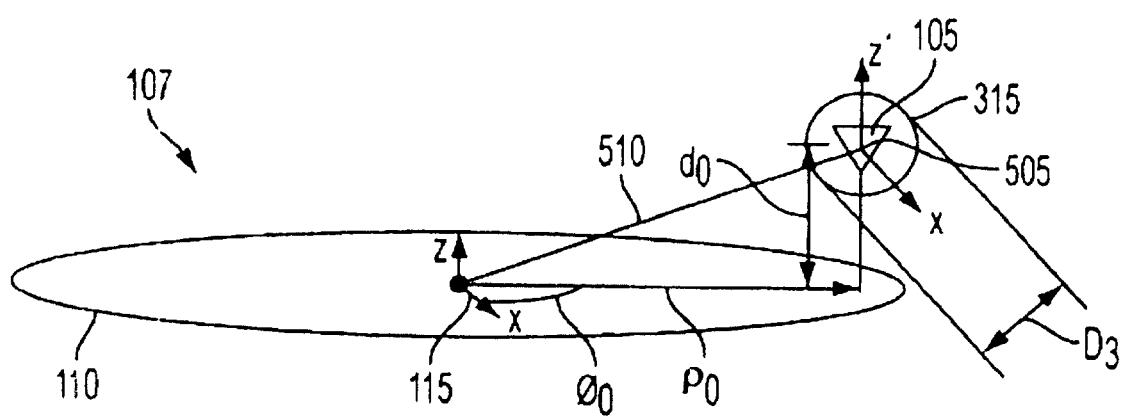
FIG. 5 illustrates a translation of the coordinate system origin for isolating a radiator in accordance with an embodiment of the present invention.

Referring to FIGS. 3 and 5, at step 225, a new origin 505 is located within the aperture of antenna 105, and its coordinates in the coordinate frame defined by origin 115 are determined. The coordinates of new origin 505 may be referred to as corresponding to a translation of the coordinate system from origin 115 to new origin 505. Referring to FIG. 5, the origin translation may be defined as a translation vector along a direction normal to the roll axis 117 from origin 115 by a distance of $\rho_0$ lying at an angle $\phi_0$, and along the direction of roll axis 117 by a distance $d_0$. The parameters $\rho_0$, $\phi_0$, and $d_0$ may be cylindrical coordinates of the translation vector. Alternatively, the translation vector may be characterized by other coordinate parameters such as Spherical or Cartesian coordinate parameters.

Processor 146 may store the values of $\rho_0$, $\phi_0$, and $d_0$ in memory 147. These values may be provided to processor 146 by the user via user interface 150. Alternatively, the values of $\rho_0$, $\phi_0$, and $d_0$ may already be stored in memory 147, in which case the user may select the values via user interface 150.

In another alternative, in step 225, the location of new origin 505 may be computed by processor 146 executing instructions to compute the location of antenna 105 by evaluating the far-field radiation pattern data computed in step 220. One skilled in the art would recognize that determination of the location of antenna 105 may be accomplished by determining the apparent phase center of the far-field radiation pattern data. Once the location of new origin 505 is determined, its location in terms of $\rho_0$, $\phi_0$, and $d_0$ may be stored in memory 147.

Step 225 may be performed at the outset of process 200, or at any point leading up to step 235 described below. Further, one skilled in the art will readily recognize that variations to the sequence and division of steps in process 200 are possible and within the scope of the invention.

At step 230, the diameter $D_3$ of third sphere 315 is determined and stored in memory 147. Referring to FIGS. 3 and 5, third sphere 315 is a minimum sphere that substantially exclusively encompasses the radiative portion of antenna 105. Third sphere 315 may have the same or approximately the same center point as that of second sphere 310, as illustrated in FIG. 3. Diameter $D_3$ may be provided by the user via interface 150, or it may be stored in memory 147 and selected by the user via user interface 150.

At step 235, processor 146 may execute instructions to compute $n_{3\ max}$, which refers to the smallest value of the maximum modal order of coefficients necessary to represent the far-field radiation pattern of antenna 105 substantially absent any interference effects of ground plane 110. The software computes this according to the following relation:

$$n_{3max} = \frac{\pi D_3}{\lambda} + 10$$

where $D_3$ is the diameter of third sphere 315 determined in step 230, and $\lambda$ is the wavelength of interest. The computed value for $n_{3\ max}$ may be stored in memory 147. The term $n_{3\ max}$ corresponds to a reduced set of coefficients relative to the number $n_{2\ max}$.

At step 240, referring to FIG. 5, processor 146 may execute instructions to compute a phase adjustment of the far-field radiation pattern, wherein the phase adjustment corresponds to the translation of origin 115 to new origin 505. Processor 146 may do so by applying the following relation:

$$\phi^{FFtranslated} = \phi^{FF} + k(d_0 \cos\theta + \rho_0 \sin\theta \cos(\phi-\phi_0))$$

where k refers to wave number ($2\pi/\lambda$); $\theta$ is the far-field polar angle; $\phi_0$ is the azimuthal angle of translation from origin 115 to new origin 505; $\phi$ is the far-field azimuth angle; and $\phi^{FF}$ is the phase of the far-field radiation pattern of the composite radiator at the given polar angle $\theta$ and azimuthal angle $\phi$ from origin 115.

Further to step 240, processor 146 may execute instructions to apply the phase correction $k(d_0 \cos\theta + \rho_0 \sin\theta \cos(\phi-\phi_0))$. In applying the phase correction, processor 146 may execute instructions to combine the phase correction $k(d_0 \cos\theta + \rho_0 \sin\theta \cos(\phi-\phi_0))$ with the phase $\phi^{FF}$ of the far-field composite radiator 107 (from the FarFieldCompositeRadiator term computed in step 220) to generate a new representation of the far-field pattern relative to the new origin 505, which may now be termed the FarFieldTranslatedCompositeRadiator. Processor 146 may further execute instructions to generate a new set of coefficients $T_{s,m,n}^{trans}$ according to the following relation.

$$FarFieldTranslatedCompositeRadiator = \sum_{n=1}^{n2max} \sum_{m=-n}^{m=n} \sum_{s=1}^{s=2} T_{s,m,n}^{trans} \cdot Mode_{s,m,n}$$

The coefficients $T_{s,m,n}^{trans}$ may be evaluated from the expression for FarFieldTranslatedCompositeRadiator using computational techniques that are known to the art, such as those disclosed in Hansen (cited above).

The effect of step 240 may be a transformation from a first far-field radiation pattern to a second far-field radiation pattern having a phase correction consistent with a translation of the origin from origin 115 to new origin 505.

At step 245, processor 146 may execute instructions to filter the translated far-field radiation pattern computed in step 240, such that the effects of ground plane 110 on the far-field radiation pattern are substantially removed. This may be done by truncating the coefficients $T_{x,m,n}^{trans}$ above $n_{3\ max}$ in the above equation for the far-field radiation pattern. This results in the following modified relation:

$$FarFieldAntennaOnly = \sum_{n=1}^{n3max} \sum_{m=-n}^{m=n} \sum_{s=1}^{s=2} T_{s,m,n}^{trans} \cdot Mode_{s,m,n}$$

whereby all the coefficients from $n_{3\ max}$ to $n_{2\ max}$ are removed.

At step 250, processor 146 may execute instructions to compute the far-field radiation pattern of antenna 105 based on the relation described in step 245. The resulting far-field radiation pattern may be substantially absent of any interference effects of ground plane 110 according to the relation for FarFieldAntennaOnly above.

There may be a tradeoff in defining the diameter $D_3$ of third sphere 315 in step 230. For example, if antenna 105 is a monopole or dipole, in which the radiative surface of antenna 105 extends to the surface of ground plane 110, the tradeoff may involve defining a minimum sphere for third sphere 315 that encompasses as much of radiative portion of antenna 105 without encompassing any of ground plane 110. In the case of a smaller diameter $D_3$ of third sphere 315, there will be fewer coefficients, and thus lower required precision in defining the far-field radiation pattern of antenna 105. On the other hand, in the case of a larger diameter $D_3$ of third sphere 315, there will be more resulting coefficients and thus a greater precision required to define the far-field radiation pattern of antenna 105. However, in this latter case, the larger third sphere 315 may capture a portion of ground plane 110, thereby contaminating the computed far-field radiation pattern with ground plane interference effects. It will be readily apparent to one of ordinary skill that third sphere 315, as a minimum sphere, may have different diameters according to this trade-off.

Variations to process 200 are possible. For example, the determination of diameter $D_3$ of third sphere 315 (step 230) may be incorporated into step 205. As stated above, one skilled in the art will readily appreciate that variations to the sequence of steps in process 200 are possible and within the scope of the invention.

Further, if scan probe 135 is a single-ported microwave horn antenna, step 215 may be performed twice, once per polarization orientation. Here, scan probe 135 may be manually oriented around range axis 119. In this case, step 215 may be performed with scan probe 135 at a first polarization orientation, and then repeated with scan probe at a second (orthogonal) polarization orientation. Alternatively, scan probe 135 may be dual-ported microwave horn antenna. In this case, dual-ported scan probe 135 may include an orthomode transducer, and receiver 140 may include a duplexer, to provide near simultaneous acquisition of two polarization orientations in step 215.

Further, process 200 may be performed iteratively in the case of a composite radiator having multiple antennas, so that the far-field radiation pattern of each antenna may be determined as described above. In this case, each antenna may have its own corresponding diameters $D_2$ and $D_3$. Because a single first sphere 300 would serve as a minimum sphere for the composite radiator with multiple antennas, only one value of $D_1$ may be required. Also, it will be apparent that in the case of multiple antennas, ground plane 110 as discussed above will include the other antennas not included within third sphere 315 of a given iteration of process 200. Further to the case of multiple antennas, the acquisition of near-field data (step 215) would only need to be done once, since the angular sample spacing of the near-field scan ($\Delta\theta_{in}$ and $\Delta\phi_{in}$) is a function of $D_1$.

Various software implementations of process 200 are possible and within the scope of the invention. For example, a single software module may be developed that implements the transformation from near-field data to far-field pattern, and from far-field pattern to coefficients, as described above. In such a case, the single software module may accept such parameters as the output angular sample spacing, the near-field data, and a phase correction, as inputs. It will be readily apparent to one of ordinary skill in the art that many such variations to the software implementation of process 200 are possible and within the scope of the invention.

Figure 6:
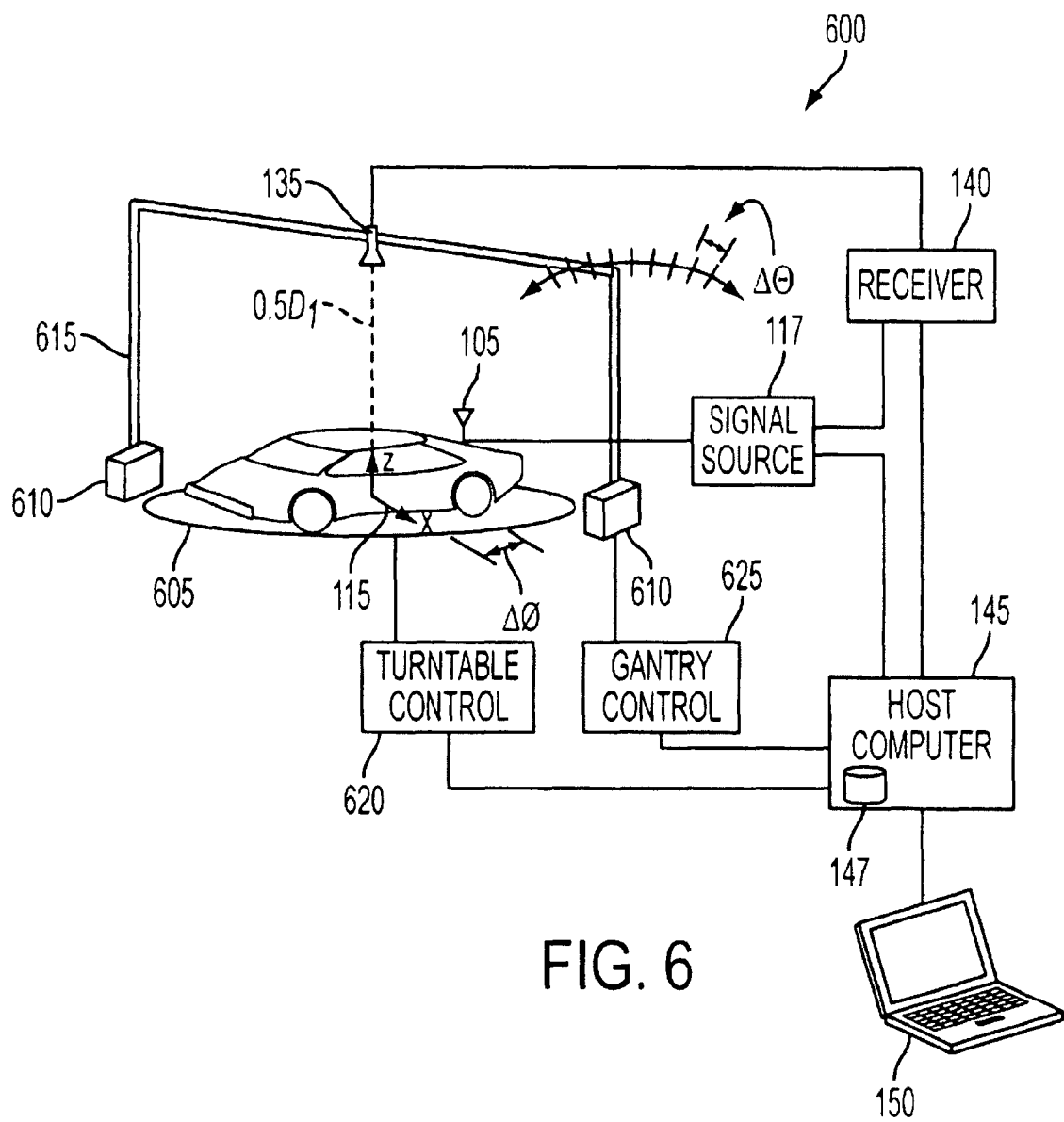
FIG. 6 illustrates another exemplary system for determining the far-field radiation pattern for an antenna mounted on an automobile in accordance with an embodiment of the present invention.

FIG. 6 illustrates another exemplary system 600 for determining the far-field radiation pattern of an antenna in the presence of a composite set of radiators according to the present invention. System 600 may be used in the case in which antenna 105 is mounted to a large object, such as a vehicle, boat, aircraft, spacecraft, large phased antenna array, etc.

System 600 may have components substantially similar to those in system 100 described above. Possible exceptions include a turntable 605; a gantry 615; a turntable control 620 connected to turntable 605 and host computer 145; and a gantry control 625 that is connected to gantry actuators 610 and host computer 145. Turntable control 620 and gantry control 625 may be included within a single two-axis control system that is connected to host computer 145. It will be readily apparent to one skilled in the art that many such variations to system 600 are possible and within the scope of the invention.

The combination of turntable 605 and gantry 615 may perform substantially similar two-axis control as the two-axis position control system 112 described above. However, in system 600, gantry 615 may rotate scan probe 135 around origin 115, which may be located substantially at the rotation axis of turntable 605. Accordingly, system 600 may be referred to as a "moving line of sight" antenna measurement system.

Variations to systems 100 and 600 are possible and within the scope of the invention. For example, in system 100, scan probe 135 may be connected to signal source 141, and antenna 105 may be connected to receiver 140. The same is true for system 600. One skilled in the art will readily recognize that the principle of antenna reciprocity may apply, and that the software may be modified accordingly.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for determining a far-field pattern of an antenna within a composite radiator, comprising:
   performing a near-field scan of the composite radiator;
   computing a first plurality of coefficients corresponding to the near-field scan;
   computing a first far-field pattern corresponding to the first plurality of coefficients;
   computing a phase adjustment corresponding to a translation from a scan origin to a point within the antenna;
   computing a second far-field pattern corresponding to the first far-field pattern and the phase adjustment, the second far-field pattern having a second plurality of coefficients;
   reducing the second plurality of coefficients to a third plurality of coefficients, wherein a quantity of the third plurality of coefficients corresponds to a minimum sphere that is centered at the point within the antenna and substantially exclusively encompasses the antenna; and
   computing a third far-field pattern corresponding to the third plurality of coefficients.

2. A system for determining a far-field radiation pattern of an antenna included within a composite radiator, comprising:
   a scan probe;
   a two-axis position control system; and
   a host computer coupled to the two-axis position control system, the host computer having a non-transitory computer readable medium encoded with a program for measuring a near-field radiating pattern according to a spherical scan at an angular sample spacing; computing a first plurality of coefficients corresponding to the near-field pattern; computing a phase adjustment corresponding to a translation from an origin corresponding to the spherical scan to a point within the antenna; computing a second plurality of coefficients, wherein the second plurality of coefficients corresponds to a far field pattern and the phase adjustment; reducing the second plurality of coefficients according to a minimum sphere substantially exclusively encompassing the antenna; computing a third plurality of coefficients corresponding to the reduced second plurality of coefficients; and computing the far-field radiation pattern based on the third plurality of coefficients.

3. The system of claim 2, wherein the antenna is coupled to a signal source, and the scan probe is coupled to a receiver.

4. The system of claim 2, wherein the program for measuring the near-field pattern comprises a program for computing the angular sample spacing based on a diameter of a first minimum sphere encompassing the composite radiator and having a center at the origin.

5. The system of claim 4, wherein computing the angular sample spacing includes computing a first quantity corresponding to a smallest maximum spherical modal order necessary to sample a contour of a composite radiator far-field pattern.

6. The system of claim 5, wherein computing the second plurality of coefficients quantity includes computing a quantity of the second plurality of coefficients corresponding to a second sphere that encompasses the composite radiator, wherein the second sphere has a center that is located within the antenna.

7. The system of claim 5, wherein computing a second plurality of coefficients includes computing a plurality of far field coefficients corresponding to the first plurality of coefficients, and adding the phase adjustment to the far field coefficients.

8. The system of claim 7, wherein the far field coefficients include vector spherical harmonic coefficients.

9. The system of claim 2, wherein the two axis position control system comprises:
a turntable connected to a turntable controller; and
a gantry connected to a gantry controller.

10. The system of claim 2, wherein the composite radiator comprises a roof of a car.

11. The system of claim 2, wherein the composite radiator comprises a phased-array antenna.

12. A method for determining a far-field pattern of an antenna within a composite radiator, comprising:
performing a near-field scan of the composite radiator, wherein the near-field scan has a range length greater than one half a diameter of a first minimum sphere that encompasses the composite radiator and has a first center at an origin defined by a crossing point of a pair of scan coordinate axes;
computing a first far-field pattern corresponding to the near-field scan, the first far-field pattern having a first plurality of coefficients corresponding to a sampling on a second minimum sphere encompassing the composite radiator and having a center within the antenna;
computing a phase adjustment corresponding to a translation from the origin to a center of a third minimum sphere, wherein the center of the third minimum sphere is located within the antenna, and wherein the third minimum sphere substantially exclusively encompasses a radiating portion of the antenna;
computing a second far-field pattern that includes the phase adjustment, the second far-field pattern having a second plurality of coefficients;
selecting a third plurality of coefficients from the second plurality of coefficients, wherein a quantity of the third plurality corresponds to a diameter of the third minimum sphere; and
computing a third far-field pattern based on the third plurality of coefficients.

13. The method of claim 12, wherein the near-field scan has a sample spacing corresponding to a diameter of the first minimum sphere.

14. The method of claim 13, wherein the sample spacing is in part based on the diameter of the first minimum sphere and a wavelength of interest.

15. A non-transitory computer readable medium encoded with a program for determining a far-field pattern of an antenna within a composite radiator, the program comprising instructions for:
measuring a near-field radiating pattern according to a spherical scan at an angular sample spacing;
computing a first plurality of coefficients corresponding to the near-field pattern;
computing a phase adjustment corresponding to a translation from an origin corresponding to the spherical scan to a point within the antenna;
computing a second plurality of coefficients, wherein the second plurality of coefficients correspond to a far field pattern and the phase adjustment;
reducing the second plurality of coefficients according to a minimum sphere substantially exclusively encompassing the antenna;
computing a third plurality of coefficients corresponding to the reduced second plurality of coefficients; and
computing the far-field pattern based on the third plurality of coefficients transitory and non-transitory.

16. The computer readable medium of claim 15, wherein the angular sample spacing corresponds to a first sphere that encompasses the composite radiator, wherein the first sphere has a center that is located at the origin.

17. The computer readable medium of claim 16, wherein a quantity of the second plurality of coefficients corresponds to a second sphere that encompasses the composite radiator, wherein the second sphere has a center that is located within the antenna.

18. The computer readable medium of claim 17, wherein computing a second plurality of coefficients comprises computing a plurality of far field coefficients corresponding to the first plurality of coefficients, and adding the phase adjustment to the far field coefficients.

19. The computer readable medium of claim 18, wherein the far field coefficients include vector spherical harmonic coefficients.

20. The computer readable medium of claim 19, wherein the spherical modal coefficients are a function of polarization, azimuth angle, and polar angle.

* * * * *